(12) United States Patent
Xiao

(10) Patent No.: US 12,016,150 B2
(45) Date of Patent: Jun. 18, 2024

(54) FOLDABLE CONDUCTIVE GUIDE RAIL

(71) Applicant: INSPUR SUZHOU INTELLIGENT TECHNOLOGY CO., LTD., Jiangsu (CN)

(72) Inventor: Pengxiao Xiao, Jiangsu (CN)

(73) Assignee: INSPUR SUZHOU INTELLIGENT TECHNOLOGY CO., LTD., Jiangsu (CN)

( * ) Notice: Subject to any disclaimer, the term of this patent is extended or adjusted under 35 U.S.C. 154(b) by 0 days.

(21) Appl. No.: 17/768,362

(22) PCT Filed: May 28, 2020

(86) PCT No.: PCT/CN2020/092839
§ 371 (c)(1),
(2) Date: Apr. 12, 2022

(87) PCT Pub. No.: WO2021/068516
PCT Pub. Date: Apr. 15, 2021

(65) Prior Publication Data
US 2023/0389216 A1 Nov. 30, 2023

(30) Foreign Application Priority Data

Oct. 12, 2019 (CN) .......................... 201910969235.4

(51) Int. Cl.
*H05K 7/14* (2006.01)
*H01R 25/14* (2006.01)

(52) U.S. Cl.
CPC ......... *H05K 7/1492* (2013.01); *H01R 25/145* (2013.01)

(58) Field of Classification Search
CPC ............................ H05K 7/1492; H01R 25/145
See application file for complete search history.

(56) References Cited

U.S. PATENT DOCUMENTS 6,215,674 B1   4/2001  Bertolami
6,666,340 B2  12/2003  Basinger et al.
(Continued)

FOREIGN PATENT DOCUMENTS

CN   2671301 Y   1/2005
CN   2731538 Y  10/2005
(Continued)

OTHER PUBLICATIONS

International Search Report dated Aug. 26, 2020; International Application No. PCT/CN2020/092839.
(Continued)

*Primary Examiner* — Anthony Q Edwards
*Assistant Examiner* — Hung Q Dang
(74) *Attorney, Agent, or Firm* — DINSMORE & SHOHL LLP

(57) ABSTRACT

A foldable conductive guide rail includes: an outer guide rail being electrically connected to a power supply of the box body by an outer guide rail pad and having an outer slideway, the outer slideway having a hollow rail and being provided with tenons at two ends; an inner guide rail being electrically connected to a mounting device by an inner guide rail pad and having an inner slideway opposite to the outer slideway, the inner slideway having a hollow rail and being provided with tenons at two ends; and a plurality of rivets, including outer rivets and inner rivets, the plurality of rivets electrically connecting the outer guide rail and the inner guide rail and enabling the outer rail and the inner rail to move relative to each other under the action of an external force.

10 Claims, 4 Drawing Sheets

(56) References Cited

U.S. PATENT DOCUMENTS

| | | | | |
|---|---|---|---|---|
| 8,297,723 | B2* | 10/2012 | Chen | E05B 65/463 312/333 |
| 9,450,358 | B2* | 9/2016 | Ehlen | H05K 7/1492 |
| 10,406,942 | B2* | 9/2019 | Kimura | B60N 2/0875 |
| 10,966,521 | B2* | 4/2021 | Chen | A47B 88/49 |
| 2009/0034181 | A1 | 2/2009 | Gizycki | |
| 2014/0231131 | A1 | 8/2014 | Sekino et al. | |
| 2018/0151995 | A1 | 5/2018 | Herring et al. | |
| 2018/0184540 | A1* | 6/2018 | Zhou | G11B 33/128 |

FOREIGN PATENT DOCUMENTS

| | | |
|---|---|---|
| CN | 201563328 U | 8/2010 |
| CN | 201667482 U | 12/2010 |
| CN | 201717473 U | 1/2011 |
| CN | 102438422 A | 5/2012 |
| CN | 202269130 U | 6/2012 |
| CN | 202873246 U | 4/2013 |
| CN | 103906399 A | 7/2014 |
| CN | 104460884 A | 3/2015 |
| CN | 204887823 U | 12/2015 |
| CN | 107613713 A | 1/2018 |
| CN | 108123337 A | 6/2018 |
| CN | 208047108 U | 11/2018 |
| CN | 208423379 U | 1/2019 |
| CN | 110096115 A | 8/2019 |
| CN | 209374826 U | 9/2019 |
| CN | 110730585 A | 1/2020 |
| EP | 0219134 A2 | 4/1987 |
| EP | 3291660 A1 | 7/2018 |
| TW | 201440349 A | 10/2014 |
| WO | 1990003101 A1 | 3/1990 |

OTHER PUBLICATIONS

First Office Action of Corresponding Chinese Application No. 201910969235.4, 9 pages.

Second Office Action of Corresponding Chinese Application No. 201910969235.4, 6 pages.

* cited by examiner

FOLDABLE CONDUCTIVE GUIDE RAIL

CROSS-REFERENCE TO RELATED APPLICATIONS

This application is the U.S. National Stage of PCT/CN2020/092839 filed on May 28, 2020, which claims priority to Chinese patent application No. 201910969235.4, filed on Oct. 12, 2019, the disclosure of which is hereby incorporated by reference in its entirety.

FIELD OF THE INVENTION

The present invention relates to the field of machinery, more specifically, to a foldable conductive guide rail.

BACKGROUND OF THE INVENTION

Servers are required to have high stability, and high-density servers cannot be shut down casually. When a daughtercard module, a hard disk or the like is damaged, the damaged module needs to be replaced under normal operation of the servers. There is limited space for each node in a high-density server room, and a case cover cannot be opened. The daughtercard module is placed on a pull-out bearing board. An administrator can pull out the bearing board directly without interrupting power to replace the daughtercard module on the bearing board in case of module failure.

When the bearing board is moved, a long enough power supply cable is required between the bearing board and a power supply board. An excessively long cable may lead to problems such as a voltage drop, increased power loss, and cable heating. In fact, the power supply cable needs to be pulled out only to replace the daughtercard module, and needs to be folded together during operation. In this case, the server is subject to the loss of power on the cable.

There is still no effective solution to the problem of excessive loss of power on a power supply cable in the prior art.

SUMMARY OF THE INVENTION

In view of this, an objective of the embodiments of the present invention is to provide a conductive guide rail that can be extended or retracted according to actual use requirements, and has a long power supply link when extended and has a small conductive impedance when retracted.

Based on the foregoing objective, embodiments of the present invention provide a foldable conductive guide rail, including:
  an outer guide rail fixed on a box body, the outer guide rail being electrically connected to a power supply of the box body by an outer guide rail pad and having an outer slideway, the outer slideway having a hollow rail and being provided with tenons at two ends;
  an inner guide rail fixed on a bearing plate, the inner guide rail being electrically connected to a mounting device by an inner guide rail pad and having an inner slideway opposite to the outer slideway, the inner slideway having a hollow rail and being provided with tenons at two ends;
  a plurality of rivets, including outer rivets and inner rivets, one end of each outer rivet being fixed within the tenon of the outer slideway, the other end thereof being slidable in the hollow rail of the inner slideway, one end of each inner rivet being fixed within the tenon of the inner slideway, the other end thereof being slidable in the hollow rail of the outer slideway, the plurality of rivets electrically connecting the outer guide rail and the inner guide rail and enabling the outer rail and the inner rail to move relative to each other under the action of an external force.

In some embodiments, the outer guide rail and the inner guide rail are made of good conductors of electricity.

In some embodiments, sides of the outer guide rail and the inner guide rail opposite to each other are covered with insulating layers.

In some embodiments, sides of the outer guide rail and the inner guide rail facing each other are covered with conductive layers; and In some embodiments, one end of the outer rivet is fixed within the tenon of the outer slideway close to an end of the inner guide rail; and one end of the inner rivet is fixed within the tenon of the inner slideway close to an end of the outer guide rail.

Embodiments of the present invention provide another foldable conductive guide rail, including:
  an outer guide rail fixed on a box body, the outer guide rail being electrically connected to a power supply of the box body by an outer guide rail pad and having an outer slideway, the outer slideway having a hollow rail and being provided with tenons at two ends;
  an inner guide rail fixed on a bearing plate, the inner guide rail being electrically connected to a mounting device by an inner guide rail pad and having an inner slideway opposite to the outer slideway, the inner slideway having a hollow rail and being provided with tenons at two ends;
  a plurality of intermediate guide rails arranged side by side between the outer guide rail and the inner guide rail, each of the plurality of intermediate guide rails being provided with an intermediate slideway, each intermediate slideway having a hollow rail and being provided with tenons at two ends; and a plurality of rivets, including outer rivets, inner rivets, and a plurality of intermediate rivets, one end of each outer rivet being fixed within the tenon of the outer slideway, the other end thereof being slidable in the hollow rail of one intermediate slideway, one end of each inner rivet being fixed within the tenon of the inner slideway, the other end thereof being slidable in the hollow rail of one intermediate slideway, a quantity of the intermediate rivets being twice a quantity of the intermediate guide rails, one end of each intermediate rivet being fixed within the tenon of the intermediate outer slideway, the other end thereof being slidable in the hollow rail, the outer guide rail, and the inner guide rail, the plurality of rivets electrically connecting the outer guide rail, the inner guide rail, and the plurality of intermediate guide rails and enabling the outer guide rail, the inner guide rail, and the plurality of intermediate guide rails to move relative to each other under the action of an external force.

In some embodiments, the outer guide rail, the inner guide rail, and the plurality of intermediate guide rails are made of good conductors of electricity.

In some embodiments, sides of the outer guide rail and the inner guide rail opposite to each other are covered with insulating layers.

In some embodiments, sides of the outer guide rail and the inner guide rail facing each other are covered with conductive layers; and both sides of the plurality of intermediate guide rails are covered with conductive layers.

In some embodiments, one end of the outer rivet is fixed within the tenon of the outer slideway close to an end of the inner guide rail; and one end of the inner rivet is fixed within the tenon of the inner slideway close to an end of the outer guide rail.

The present invention has the following beneficial technical effects: The foldable conductive guide rail provided in the embodiments of the present invention includes: an outer guide rail fixed on a box body, the outer guide rail being electrically connected to a power supply of the box body by an outer guide rail pad and having an outer slideway, the outer slideway having a hollow rail and being provided with tenons at two ends; an inner guide rail fixed on a bearing plate, the inner guide rail being electrically connected to a mounting device by an inner guide rail pad and having an inner slideway opposite to the outer slideway, the inner slideway having a hollow rail and being provided with tenons at two ends; and a plurality of rivets, including outer rivets and inner rivets, one end of each outer rivet being fixed within the tenon of the outer slideway, the other end thereof being slidable in the hollow rail of the inner slideway, one end of each inner rivet being fixed within the tenon of the inner slideway, the other end thereof being slidable in the hollow rail of the outer slideway, the plurality of rivets electrically connecting the outer guide rail and the inner guide rail and enabling the outer rail and the inner rail to move relative to each other under the action of an external force. In the technical solution, the conductive guide rail can be extended or retracted according to actual use requirements, and has a long power supply link when extended and has a small conductive impedance when retracted.

BRIEF DESCRIPTION OF THE DRAWINGS

For clearer descriptions of the technical solutions in the embodiments of the present invention or the prior art, the following briefly introduces the accompanying drawings required for describing the embodiments the prior art. Apparently, the accompanying drawings in the following description show merely some embodiments of the present invention, and persons of ordinary skill in the art may still derive other drawings from these accompanying drawings without creative efforts.

DETAILED DESCRIPTION OF THE INVENTION

To make the objectives, technical solutions, and advantages of the present invention more comprehensible, the embodiments of the present invention are further described below in detail with reference to specific embodiments and the accompanying drawings.

It should be noted that all the expressions using "first" and "second" are used in the embodiments of the present invention to distinguish between two different entities or different parameters with the same name. It can be seen that "first" and "second" are only for the convenience of expression but should not be understood as a limitation to the embodiments of the present invention. This is not described again in subsequent embodiments.

Figure 1:
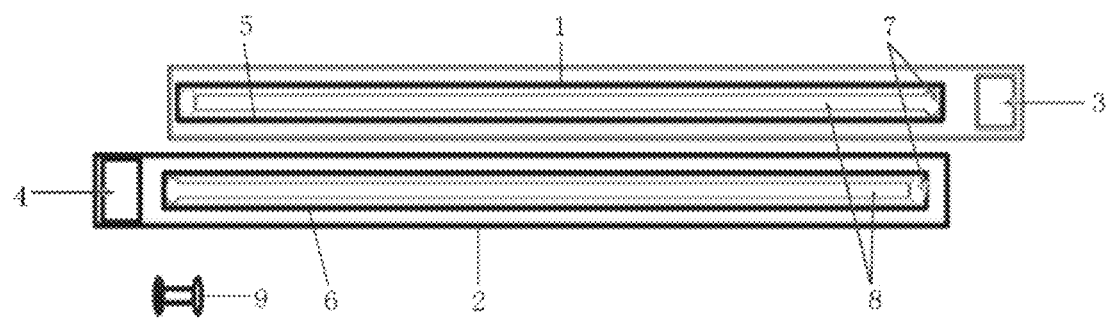
FIG. 1 is a split schematic structural diagram of a foldable conductive guide rail according to the present invention.

Based on the foregoing objective, in a first aspect of embodiments of the present invention, an embodiment of a conductive guide rail that can be extended or retracted according to actual use requirements is provided. FIG. 1 is a split schematic structural diagram of a foldable conductive guide rail according to the present invention.

As shown in FIG. 1, the foldable conductive guide rail includes: an outer guide rail 1 fixed on a box body, the outer guide rail 1 being electrically connected to a power supply of the box body by an outer guide rail pad 3 and having an outer slideway 5, the outer slideway 5 having a hollow rail 8 and being provided with tenons 7 at two ends; an inner guide rail 2 fixed on a bearing plate, the inner guide rail 2 being electrically connected to a mounting device by an inner guide rail pad 4 and having an inner slideway 156 opposite to the outer slideway 5, the inner slideway 6 having a hollow rail 8 and being provided with tenons 7 at two ends; and a plurality of rivets 9, including outer rivets and inner rivets, one end of each outer rivet being fixed within the tenon 7 of the outer slideway 5, the other end thereof being slidable in the hollow rail 8 of the inner slideway 6, one end of each inner rivet being fixed within the tenon 7 of the inner slideway 6, the other end thereof being slidable in the hollow rail 8 of the outer slideway 5, the plurality of rivets 9 electrically connecting the outer guide rail 1 and the inner guide rail 2 and enabling the outer rail and the inner rail to move relative to each other under the action of an external force.

In some embodiments, the outer guide rail 1 and the inner guide rail 2 are made of good conductors of electricity.

In some embodiments, sides of the outer guide rail 1 and the inner guide rail 2 opposite to each other are covered with insulating layers.

In some embodiments, sides of the outer guide rail 1 and the inner guide rail 2 facing each other are covered with conductive layers; and In some embodiments, one end of the outer rivet is fixed within the tenon 7 of the outer slideway 5 close to an end of the inner guide rail 2; and one end of the inner rivet is fixed within the tenon 7 of the inner slideway 6 close to an end of the outer guide rail 1.

Figure 2:
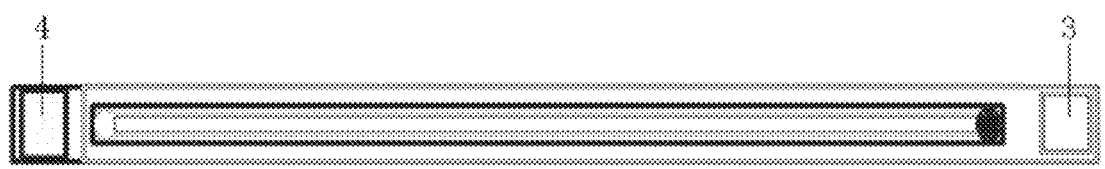
FIG. 2 is a schematic structural diagram of a foldable conductive guide rail being retracted according to the present invention.
Figure 3:
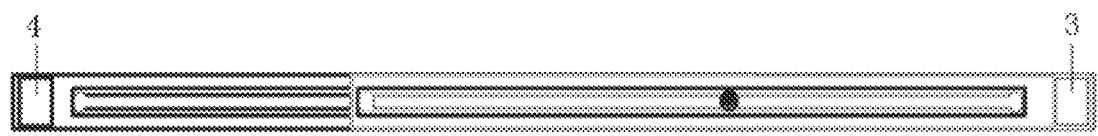
FIG. 3 is a schematic structural diagram of a foldable conductive guide rail being half extended according to the present invention.
Figure 4:
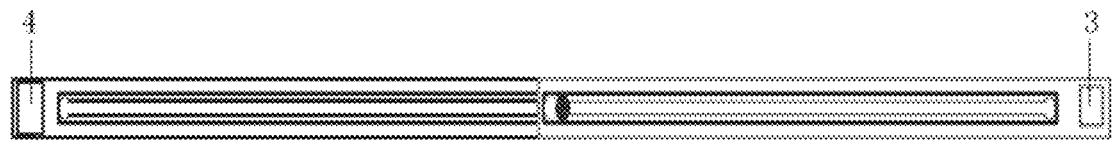
FIG. 4 is a schematic structural diagram of a foldable conductive guide rail being extended according to the present invention.
Figure 8:
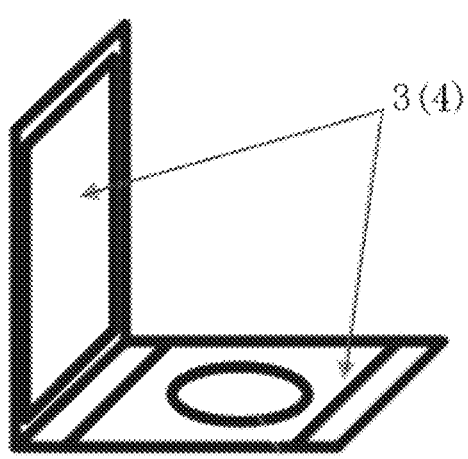
FIG. 8 is a schematic structural diagram of a pad of a foldable conductive guide rail according to the present invention.

As shown in FIG. 2, FIG. 3, and FIG. 4, each rivet 9 has one end being fixed at the tenon 7 of a guide rail and the other end being not fixed, passes through the hollow rails 8 to connect two guide rails, and is slidable in concave slideways 4. A central post of the rivet 9 is slightly narrower than the hollow rails 8. The guide rails are provided with the concave slideways 4 to ensure that the rivets 9 do not affect each other when the guide rails slide. The guide rails are provided with the hollow rails 8 in the middle for the rivets 9 to slide and fix the guide rails. The tenons 7 that are slightly wider than the rails are provided at two ends of the rails for fixing the rivets 9 and slide positioning. An insulating varnish is sprayed on outer sides of the guide rails, and copper is exposed on inner sides. A pad is provided at an end of each guide rail for soldering between a card and the guide rail. For convenient use, the pad is combined with a pad connector as shown in FIG. 8 to meet use requirements of various mechanisms.

Figure 9:
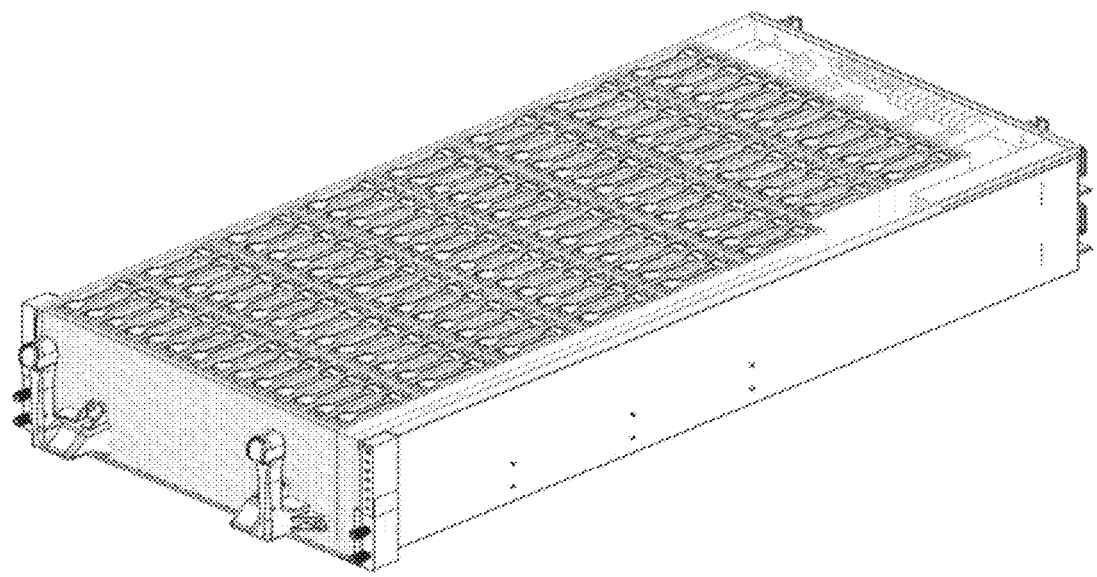
FIG. 9 shows a case using a foldable conductive guide rail according to the present invention.

During use, a multi-section power supply guide rail is connected to the power supply and the bearing plate by the pad. An insulating isolation layer is added around the power supply guide rail, and the power supply guide rail and a ground wire guide rail are isolated. It is set that each guide rail has a resistance of R. When a server system operates normally, the bearing plate is located inside a case. In this case, the power supply guide rail is in a retracted state, and the impedance of the power supply guide rail is R/2. When a daughtercard module needs to be replaced for a server, the bearing plate is pulled out from inside the case. In this case, the power supply guide rail is in an extended state, and the impedance of the power supply guide rail is R*2. After the replacement of a daughtercard module, the bearing plate is pushed back to the case shown in FIG. 9. The server returns to a normal operating state, and the power supply guide rail returns to a retracted state. During the use of the server, the time of thermal maintenance is very short. Therefore, with the use of the power supply guide rail, the power supply guide rail may be kept in a low impedance state. Compared with the use of a power supply cable, the loss of power can be effectively reduced, thereby reducing the risk of an excessively large voltage drop during a power consumption peak. In addition, the power supply guide rail has a compact structure to better facilitate air circulation in the case, thereby facilitate heat dissipation of the system.

As can be seen from the foregoing embodiments, the foldable conductive guide rail provided in the embodiments of the present invention includes: an outer guide rail 1 fixed on a box body, the outer guide rail 1 being electrically connected to a power supply of the box body by an outer guide rail pad 3 and having an outer slideway 5, the outer slideway 5 having a hollow rail 8 and being provided with tenons 7 at two ends; an inner guide rail 2 fixed on a bearing plate, the inner guide rail 2 being electrically connected to a mounting device by an inner guide rail pad 4 and having an inner slideway 6 opposite to the outer slideway 5, the inner slideway 6 having a hollow rail 8 and being provided with tenons 7 at two ends; and a plurality of rivets 9, including outer rivets and inner rivets, one end of each outer rivet being fixed within the tenon 7 of the outer slideway 5, the other end thereof being slidable in the hollow rail 8 of the inner slideway 6, one end of each inner rivet being fixed within the tenon 7 of the inner slideway 6, the other end thereof being slidable in the hollow rail 8 of the outer slideway 5, the plurality of rivets 9 electrically connecting the outer guide rail 1 and the inner guide rail 2 and enabling the outer rail and the inner rail to move relative to each other under the action of an external force. In the technical solution, the conductive guide rail can be extended or retracted according to actual use requirements, and has a long power supply link when extended and has a small conductive impedance when retracted.

Figure 5:
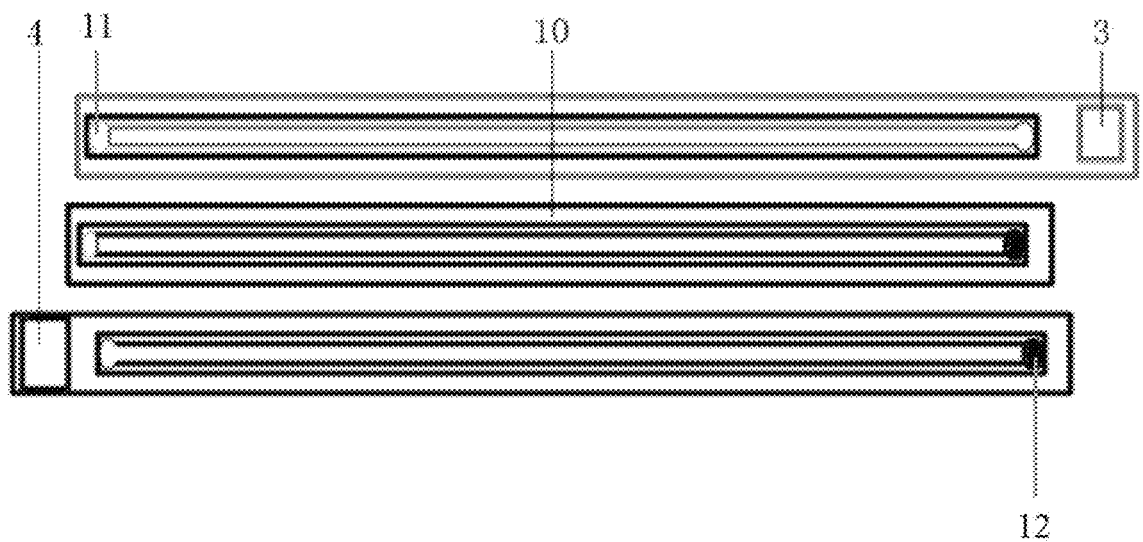
FIG. 5 is a split schematic structural diagram of another embodiment of a foldable conductive guide rail according to the present invention.

Based on the foregoing objective, in a second aspect of embodiments of the present invention, another embodiment of a conductive guide rail that can be extended or retracted according to actual use requirements is provided. FIG. 5 is a split schematic structural diagram of another foldable conductive guide rail according to the present invention.

As shown in FIG. 5, the foldable conductive guide rail includes: an outer guide rail 1 fixed on a box body, the outer guide rail 1 being electrically connected to a power supply of the box body by an outer guide rail pad 3 and having an outer slideway 5, the outer slideway 5 having a hollow rail 8 and being provided with tenons 7 at two ends; an inner guide rail 2 fixed on a bearing plate, the inner guide rail 2 being electrically connected to a mounting device by an inner guide rail pad 4 and having an inner slideway 6 opposite to the outer slideway 5, the inner slideway 6 having a hollow rail 8 and being provided with tenons 7 at two ends; a plurality of intermediate guide rails 10 arranged side by side between the outer guide rail 1 and the inner guide rail 2, each of the plurality of intermediate guide rails 10 being provided with an intermediate slideway 4, each intermediate slideway 4 having a hollow rail 8 and being provided with tenons 7 at two ends; and a plurality of rivets 9, including outer rivets 11, inner rivets 12, and a plurality of intermediate rivets, one end of each outer rivet being fixed within the tenon 7 of the outer slideway 5, the other end thereof being slidable in the hollow rail 8 of one intermediate slideway 4, one end of each inner rivet being fixed within the tenon 7 of the inner slideway 6, the other end thereof being slidable in the hollow rail 8 of one intermediate slideway 4, a quantity of the intermediate rivets being twice a quantity of the intermediate guide rails 10, one end of each intermediate rivet being fixed within the tenon 7 of the intermediate outer slideway 5, the other end thereof being slidable in the hollow rail 8, the outer guide rail 1, and the inner guide rail 2, the plurality of rivets 9 electrically connecting the outer guide rail 1, the inner guide rail 2, and the plurality of intermediate guide rails 10 and enabling the outer guide rail, the inner guide rail, and the plurality of intermediate guide rails to move relative to each other under the action of an external force.

In some embodiments, the outer guide rail 1, the inner guide rail 2, and the plurality of intermediate guide rails 10 are made of good conductors of electricity.

In some embodiments, sides of the outer guide rail 1 and the inner guide rail 2 opposite to each other are covered with insulating layers.

In some embodiments, sides of the outer guide rail 1 and the inner guide rail 2 facing each other are covered with conductive layers; and both sides of the plurality of intermediate guide rails 10 are covered with conductive layers.

In some embodiments, one end of the outer rivet is fixed within the tenon 7 of the outer slideway 5 close to an end of the inner guide rail 2; and one end of the inner rivet is fixed within the tenon 7 of the inner slideway 6 close to an end of the outer guide rail 1.

Figure 6:
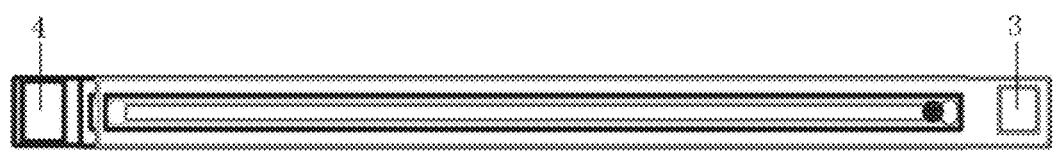
FIG. 6 is a split schematic structural diagram of another embodiment of a foldable conductive guide rail being retracted according to the present invention.
Figure 7:
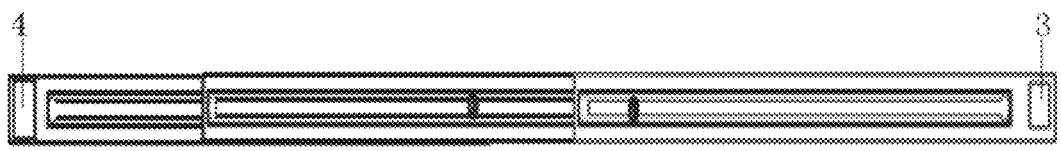
FIG. 7 is a split schematic structural diagram of another embodiment of a foldable conductive guide rail being half extended according to the present invention.

As shown in FIG. 6 and FIG. 7, during use, a multi-section power supply guide rail is connected to the power supply and the bearing plate by the pad. An insulating isolation layer is added around the power supply guide rail, and the power supply guide rail and a ground wire guide rail are isolated. It is set that each guide rail has a resistance of R and there are N intermediate guide rails 10. When a server system operates normally, the bearing plate is located inside a case. In this case, the power supply guide rail is in a retracted state, and the impedance of the power supply guide rail is R/(N+2). When a daughtercard module needs to be replaced for a server, the bearing plate is pulled out from inside the case. In this case, the power supply guide rail is in an extended state, and the impedance of the power supply guide rail is R*(N+2). After the replacement of a daughtercard module, the bearing plate is pushed back to the case shown in FIG. 9. The server returns to a normal operating state, and the power supply guide rail returns to a retracted state. During the use of the server, the time of thermal maintenance is very short. Therefore, with the use of the power supply guide rail, the power supply guide rail may be kept in a low impedance state. Compared with the use of a power supply cable, the loss of power can be effectively reduced, thereby reducing the risk of an excessively large voltage drop during a power consumption peak. In addition, the power supply guide rail has a compact structure to better facilitate air circulation in the case, thereby facilitate heat dissipation of the system.

As can be seen from the foregoing embodiments, the foldable conductive guide rail provided in the embodiments of the present invention includes: an outer guide rail 1 fixed on a box body, the outer guide rail 1 being electrically connected to a power supply of the box body by an outer guide rail pad 3 and having an outer slideway 5, the outer slideway 5 having a hollow rail 8 and being provided with tenons 7 at two ends; an inner guide rail 2 fixed on a bearing plate, the inner guide rail 2 being electrically connected to a mounting device by an inner guide rail pad 4 and having an inner slideway 6 opposite to the outer slideway 5, the inner slideway 6 having a hollow rail 8 and being provided with tenons 7 at two ends; and a plurality of rivets 9, including outer rivets and inner rivets, one end of each outer rivet being fixed within the tenon 7 of the outer slideway 5, the other end thereof being slidable in the hollow rail 8 of the inner slideway 6, one end of each inner rivet being fixed within the tenon 7 of the inner slideway 6, the other end thereof being slidable in the hollow rail 8 of the outer slideway 5, the plurality of rivets 9 electrically connecting the outer guide rail 1 and the inner guide rail 2 and enabling the outer rail and the inner rail to move relative to each other under the action of an external force. In the technical solution, the conductive guide rail can be extended or retracted according to actual use requirements, and has a long power supply link when extended and has a small conductive impedance when retracted.

Figure 10:
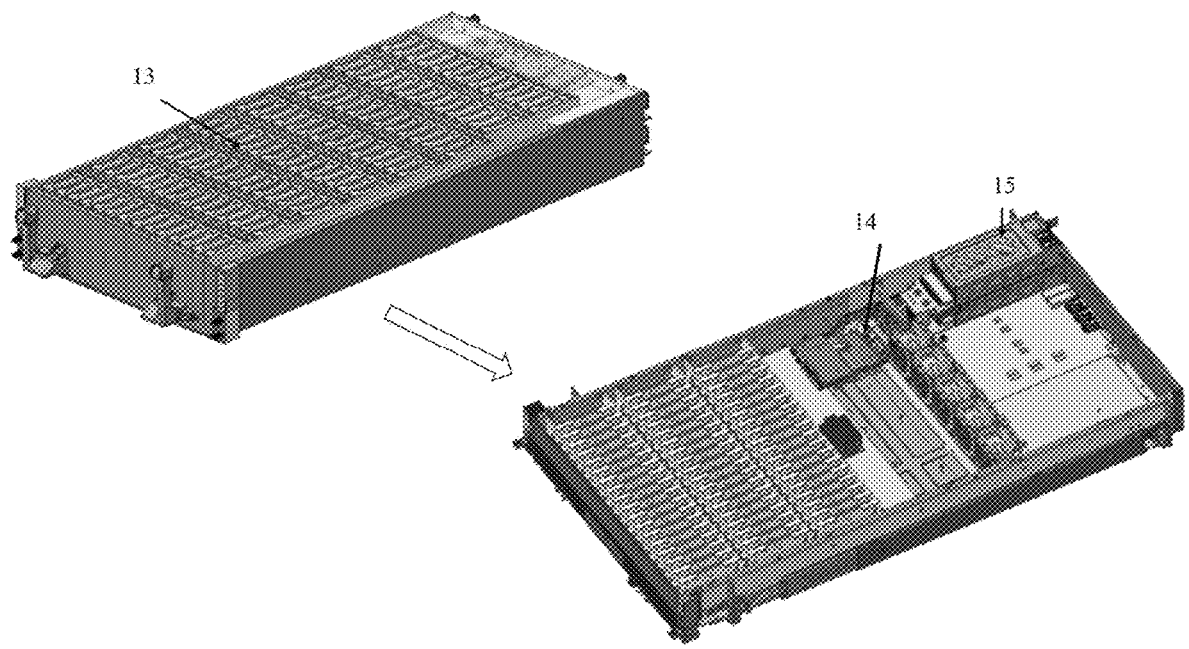
FIG. 10 shows a case and a bearing plate according to the present invention.
Figure 11:
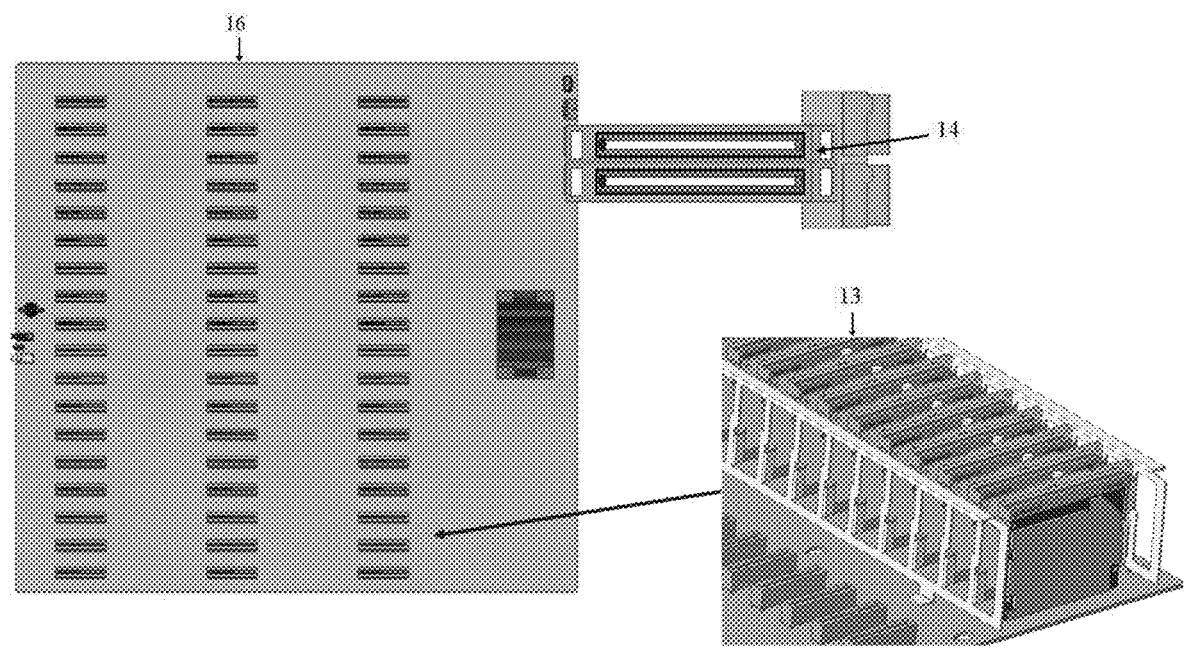
FIG. 11 shows a case, a bearing plate and a mount device according to the present invention.

As shown in FIG. 10 and FIG. 11, an outer guide rail fixed on a box body 14, the outer guide rail being electrically connected to a power supply 15 of the box body by an outer guide rail pad; an inner guide rail fixed on a bearing plate 16, the inner guide rail being electrically connected to a mounting device 13 by an inner guide rail pad.

It should be understood that, as used herein, the singular form "a" is intended to include the plural form as well, unless the context clearly supports an exception. It is also to be understood that "and/or" as used herein refers to any and all possible combinations including one or more of the items listed in connection therewith. The foregoing sequence numbers of the disclosed embodiments in the embodiments of the present disclosure are merely for the convenience of description, and do not imply the preference among the embodiments.

It should be understood by those of ordinary skill in the art that the discussion of any of the above embodiments is exemplary only and is not intended to imply that the scope of the disclosure of the embodiments of the present invention (including the claims) is limited to these examples; combinations between the technical features in the above embodiments or different embodiments are also possible in the context of the embodiments of the present invention, and many other different aspects of the embodiments of the present invention exist as described above variations, which are not provided in details for the sake of brevity. Therefore, any omission, modification, equivalent replacement, improvement, or the like made within the spirit and principle of the embodiments of the present invention shall fall within the scope of protection of the embodiments of the present invention.

The invention claimed is:

1. A conductive guide rail, comprising:
   an outer guide rail fixed on a box body, the outer guide rail being electrically connected to a power supply of the box body by an outer guide rail pad and having an outer slideway, the outer slideway having a hollow rail and being provided with tenons at two ends;
   an inner guide rail fixed on a bearing plate, the inner guide rail being electrically connected to a mounting device by an inner guide rail pad and having an inner slideway opposite to the outer slideway, the inner slideway having a hollow rail and being provided with tenons at two ends; and
   a plurality of rivets, comprising outer rivets and inner rivets, one end of each outer rivet being fixed within the tenon of the outer slideway, the other end thereof being slidable in the hollow rail of the inner slideway, one end of each inner rivet being fixed within the tenon of the inner slideway, the other end thereof being slidable in the hollow rail of the outer slideway, the plurality of rivets electrically connecting the outer guide rail and the inner guide rail and enabling the outer guide rail and the inner guide rail to move relative to each other under the action of an external force.

2. The guide rail according to claim 1, wherein the outer guide rail and the inner guide rail are made of good conductors of electricity.

3. The guide rail according to claim 2, wherein sides of the outer guide rail and the inner guide rail opposite to each other are covered with insulating layers.

4. The guide rail according to claim 1, wherein sides of the outer guide rail and the inner guide rail facing each other are covered with conductive layers.

5. The guide rail according to claim 1, wherein one end of the outer rivet is fixed within the tenon of the outer slideway close to an end of the inner guide rail; and one end of the inner rivet is fixed within the tenon of the inner slideway close to an end of the outer guide rail.

6. A conductive guide rail, comprising:
   an outer guide rail fixed on a box body, the outer guide rail being electrically connected to a power supply of the box body by an outer guide rail pad and having an outer slideway, the outer slideway having a hollow rail and being provided with tenons at two ends;
   an inner guide rail fixed on a bearing plate, the inner guide rail being electrically connected to a mounting device by an inner guide rail pad and having an inner slideway opposite to the outer slideway, the inner slideway having a hollow rail and being provided with tenons at two ends;
   a plurality of intermediate guide rails arranged side by side between the outer guide rail and the inner guide rail, each of the plurality of intermediate guide rails being provided with an intermediate slideway, each intermediate slideway having a hollow rail and being provided with tenons at two ends; and a plurality of rivets, comprising outer rivets, inner rivets, and a plurality of intermediate rivets, one end of each outer rivet being fixed within the tenon of the outer slideway, the other end thereof being slidable in the hollow rail of one intermediate slideway, one end of each inner rivet being fixed within the tenon of the inner slideway, the other end thereof being slidable in the hollow rail of one intermediate slideway, a quantity of the intermediate rivets being twice a quantity of the intermediate guide rails, one end of each intermediate rivet being fixed within the tenon of the intermediate outer slideway, the other end thereof being slidable in the hollow rail, the outer guide rail, and the inner guide rail, the plurality of rivets electrically connecting the outer guide rail, the inner guide rail, and the plurality of intermediate guide rails and enabling the outer guide rail, the inner guide rail, and the plurality of intermediate guide rails to move relative to each other under the action of an external force.

7. The guide rail according to claim 6, wherein the outer guide rail, the inner guide rail, and the plurality of intermediate guide rails are made of good conductors of electricity.

8. The guide rail according to claim 7, wherein sides of the outer guide rail and the inner guide rail opposite to each other are covered with insulating layers.

9. The guide rail according to claim 6, wherein sides of the outer guide rail and the inner guide rail facing each other are covered with conductive layers; and both sides of the plurality of intermediate guide rails are covered with conductive layers.

10. The guide rail according to claim 6, wherein one end of the outer rivet is fixed within the tenon of the outer slideway close to an end of the inner guide rail; and one end of the inner rivet is fixed within the tenon of the inner slideway close to an end of the outer guide rail.

* * * * *